United States Patent
Ishimaru

(10) Patent No.: US 6,593,604 B2
(45) Date of Patent: Jul. 15, 2003

(54) HETEROJUNCTION BIPOLAR TRANSISTOR, MANUFACTURING METHOD THEREFOR, AND COMMUNICATION DEVICE THEREWITH

(75) Inventor: Yoshiteru Ishimaru, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/772,941

(22) Filed: Jan. 31, 2001

(65) Prior Publication Data

US 2003/0038300 A1 Feb. 27, 2003

(30) Foreign Application Priority Data

Jan. 31, 2000 (JP) .......................... 2000-021950

(51) Int. Cl.[7] ............... H01L 31/0328; H01L 21/331
(52) U.S. Cl. ............... 257/197; 257/198; 257/199; 257/200; 257/201; 257/571; 257/573; 257/586; 438/309; 438/312; 438/235
(58) Field of Search .................. 257/197–201, 257/571, 573, 586; 438/312, 309, 235

(56) References Cited

U.S. PATENT DOCUMENTS

| | | | | |
|---|---|---|---|---|
| 4,746,626 A | * | 5/1988 | Eda et al. ............... | 257/198 |
| 4,935,797 A | * | 6/1990 | Jambotkar ............... | 257/197 |
| 4,954,457 A | * | 9/1990 | Jambotkar ............... | 257/197 |
| 5,023,687 A | * | 6/1991 | Tanoue et al. ........... | 257/197 |
| 5,084,750 A | * | 1/1992 | Adlerstein ............... | 257/197 |
| 5,445,976 A | * | 8/1995 | Henderson et al. ...... | 438/319 |
| 5,561,306 A | * | 10/1996 | Imamura et al. ......... | 257/197 |
| 5,569,944 A | * | 10/1996 | Delaney et al. .......... | 257/197 |
| 5,616,950 A | * | 4/1997 | Liu .......................... | 257/287 |
| 5,682,046 A | * | 10/1997 | Takahashi et al. ....... | 257/198 |
| 5,719,415 A | * | 2/1998 | Yagura et al. ............ | 257/191 |
| 5,739,062 A | * | 4/1998 | Yoshida et al. .......... | 438/312 |
| 5,767,540 A | * | 6/1998 | Shimizu ................... | 257/191 |
| 5,789,301 A | * | 8/1998 | Hill ......................... | 438/319 |
| 5,850,099 A | * | 12/1998 | Liu .......................... | 257/280 |

FOREIGN PATENT DOCUMENTS

| | | | | |
|---|---|---|---|---|
| JP | 05-275444 | * | 10/1993 | ...... H01L/21/331 |
| JP | A6244195 | | 9/1994 | |
| JP | 2000-260783 | * | 9/2000 | ...... H01L/21/331 |

* cited by examiner

*Primary Examiner*—Eddie Lee
*Assistant Examiner*—Jose' R. Diaz
(74) *Attorney, Agent, or Firm*—Birch, Stewart, Kolasch & Birch, LLP.

(57) ABSTRACT

An emitter of a heterojunction bipolar transistor has a double-layer protrusion formed of a first emitter layer and a second emitter layer and protruded outside an external base region. The protrusion of 50 nm in total thickness is enough to prevent damage during formation of the protrusion by etching or during later fabricating processes. Penetration of moisture through damaged places is eliminated. A base ohmic electrode is continuously formed on the first and second emitter layers on the external base region up to the protrusion. Thus, the protrusion is reinforced so as to be further hard to damage. By ensuring a large area for the base ohmic electrode, an alignment margin can be taken during formation of a base lead electrode.

6 Claims, 7 Drawing Sheets

US 6,593,604 B2

HETEROJUNCTION BIPOLAR TRANSISTOR, MANUFACTURING METHOD THEREFOR, AND COMMUNICATION DEVICE THEREWITH

BACKGROUND OF THE INVENTION

The present invention relates to a heterojunction bipolar transistor (hereinafter, abbreviated as HBT) and manufacturing method for HTB as well as a communication device with HTB.

Conventionally, in HBTs, there has been adopted a barrier structure in which part of an emitter layer is left on an external base region, which is defined as a region where a base layer outwardly extends from an emitter region, so that holes within the base layer are inhibited from reaching a surface of the external base on the external base region. By doing so, it becomes possible to prevent decrease of reliability due to recombination of electrons diffused from the emitter layer with holes in the base layer, which combination occurs on the surface of the external base region.

The emitter layer left on the external base region needs to be of such a thickness that the emitter layer is depleted within a bias voltage range normal for transistors in order that current does not leak between an emitter and a base through the left emitter layer. Therefore, for more reliable formation of this thickness, it has been conventional practice to form a layer using V-group phosphorus as the emitter layer, thereby providing an epitaxial structure that enables selective etching.

As an example of conventional HBTs, an HBT structure of Japanese Patent Laid-Open Publication HEI 6-244195 is shown in FIG. 11. Referring to FIG. 11, reference numeral 1 denotes a semi-insulating GaAs substrate, 2 denotes a GaAs collector contact layer, 3 denotes a GaAs collector layer, 4 denotes a GaAs base layer, 5 denotes an InGaP emitter layer, 6 denotes an AlGaAs emitter layer, 7 denotes an AlGaAs graded layer, 8 denotes a GaAs cap layer, 9 denotes an InGaAs contact layer, 10 denotes an emitter electrode, 11 denotes a base electrode, and 12 denotes a collector electrode 12. In this case, the emitter layer 5 left on the external base region in the GaAs base layer 4 is very thin, 20 nm.

However, the conventional HBT disclosed in Japanese Patent Laid-Open Publication HEI 6-244195 has the following disadvantages.

The HBT having the structure shown in FIG. 11 is fabricated as follows. First, on the semi-insulating GaAs substrate 1, individual layers from the GaAs collector contact layer 2 to the InGaAs contact layer 9 are stacked sequentially. Next, the InGaAs contact layer 9, the GaAs cap layer 8, the AlGaAs graded layer 7 and the AlGaAs emitter layer 6 are etched by an etchant of phosphorus acid/hydrogen peroxide mixed aqueous solution, and the etching is ended selectively at the InGaP emitter layer 5. Subsequently, a resist pattern 13 is formed so as to cover the external base region, and the InGaP emitter layer 5 is etched by an etchant of hydrochloric acid/phosphorus acid mixed etchant, the etching being ended the GaAs base layer 4. Then, the GaAs base layer 4 and the GaAs collector layer 3 are etched again by an etchant of phosphorus acid/hydrogen peroxide mixed aqueous solution.

However, the HBT formed in this way, actually, has the InGaP emitter layer 5 overhanging at its ends in a protruded form by a width A, as shown in FIG. 12. For the reason that in the process of etching the GaAs base layer 4 and the GaAs collector layer 3 with the etchant of phosphorus acid/hydrogen peroxide mixed aqueous solution, the GaAs base layer 4 and the GaAs collector layer 3 are etched even at their side faces, while the InGaP emitter layer 5 is not etched In that case, the InGaP emitter layer 5, which is set to such a thickness that the layer is depleted in the external base region, has quite a small thickness as thin as about 20 nm. Accordingly, in the etching process of the GaAs base layer 4 and the GaAs collector layer 3 or in later processes, the protrusion 14 may be damaged, allowing moisture or the like to penetrate through the broken places, which would cause decrease in yield and deterioration of reliability.

Therefore, in order to avoid these disadvantages, it is possible to remove the protrusion 14 of the InGaP emitter layer 5 by etching with a hydrochloric acid/phosphorus acid mixed etchant. This etching is conducted after the GaAs base layer 4 and the GaAs collector layer 3 are etched with the etchant of phosphorus acid/hydrogen peroxide mixed aqueous solution and before the resist pattern 13 is removed. In this case, however, side etching of the protrusion 14 occurs during the etching as shown in FIG. 13, so that the end of the InGaP emitter layer 5 are located inside the end of the GaAs base layer 4. As a result, the base layer 4 is exposed in an outer portion of the external base region. For this reason, the base electrode ohmic material directly contacts the base layer 4 outside the external base region. Consequently, when the base electrode ohmic material is diffused via the emitter layer 5 into the base layer 4 with ohmic junction, the base electrode ohmic material is simultaneously diffused via the base layer 4 up to the collector layer 3 in the outer portion of the external base region where the base layer 4 is exposed, as shown by broken line in FIG. 13. Accordingly, there arises a failure that a leak current flows between base and collector.

In particular, when the external base region is reduced in area for enhancement of the HBT performance, it becomes even more difficult to form the base electrode 11 while avoiding the upper surface of the base layer 4 from being exposed to the base electrode ohmic material due to the side etching of the emitter layer 5. As a result, the base electrode 11 comes into contact with the exposed portion of the base layer 4, giving rise to the failure that a leak current flows between base and collector.

As described above, conventional HBTs are low in reliability whether the protrusion is present in HBT or the protrusion has been removed by etching. Accordingly, the conventional HBTs have disadvantages of frequent failures and low durability when the conventional HBTs are used for power amplifiers in portable communication devices, which are used in wide-range environments and particularly which cannot sufficiently afford to provide for air-tightness because of demands for lightening of weight and reduction of size.

SUMMARY OF THE INVENTION

It is therefore an object of the present invention to provide an HBT as well as a manufacturing method therefor which can prevent damage of a protrusion of an emitter layer present on an external base region of the HBT, and to provide a communication device using the HBT.

In order to achieve the above object, in a first aspect of the invention, there is provided a heterojunction bipolar transistor in which an emitter mesa portion is formed of emitter layers in a mesa shape on a base layer, the emitter mesa portion having a lower layer of the emitter layers to extend up to an upper surface of an external base region which is a region of the base layer outside the base layer under the emitter mesa portion, comprising: an emitter layer formed of the lower layer in a first region present on the external base region located and next to the emitter mesa portion; and emitter layers including the lower emitter layer and forming a second region located outside the first region, wherein the emitter layers in the second region is thicker than emitter layer in the first region.

Normally, thickness of the lower layer of the emitter mesa portion extending to the external base region is set to such a thickness that an emitter layer of the lower layer is depleted within a normal bias voltage range to prevent current leaks between an emitter and a base through the emitter layer. For this purpose, it is necessary to deplete the emitter layer within a range from a base electrode formed on the external base region up to the emitter mesa portion. The rest of the emitter layer present on the external base region may be made thick without causing any problem.

With this constitution, as to thickness of the emitter layer or layers on the external base region, the emitter layers in the second region located outside the first region is thicker than the emitter layer in the first region located next to the emitter mesa portion. Therefore, the emitter layer in the first region can be set to such a thickness that the depletion can be achieved, while the emitter layers in the second region can be set to such a thickness that the strength of the protrusion formed by the emitter layers overhanging outside from the external base region is increased.

In one embodiment, there is a protrusion in the second region, the protrusion overhanging outside the external base region.

With this constitution, there is the protrusion, which overhangs outside the external base region, in the second region. Therefore, there is no part where the base layer is exposed in the external base region, so that distance between the base layer and a base ohmic electrode to be formed later in the external base region becomes generally uniform. Thus, even when mis-alignment has occurred during formation of the base ohmic electrode on the external base region, the base electrode material is uniformly diffused into the base layer in the depthwise direction thereof. As a result, it can be prevented that the base ohmic electrode comes into direct contact with the base layer to cause the base electrode material to diffuse up to the collector layer. Thus, occurrence of leak currents between base and collector can be prevented.

In one embodiment, a boundary between the first region and the second region is present on the external base region.

With this constitution, since the boundary between the first region and the second region is present on the external base region, the emitter layers in the second region has been overlaid on the external base region. Therefore, strength of the protrusion outgoing from the external base region is increased. In particular, the strength of the protrusion is improved when the emitter layers in the second region are overlaid over the entire periphery of the external base region or the longitudinal peripheries of the external base region.

In one embodiment, a base electrode is provided on the second region ranged from the periphery of the first region on the external base region to the protrusion.

Reduction in an area of the external base region for characteristic improvement makes it difficult to form a base electrode or to attain connections between the base electrode and base leads. In this embodiment, however, the base electrode is provided on the second region ranged from the periphery of the first region on the external base region to the protrusion. Therefore, the base electrode can be formed with a large pattern. Therefore, even when characteristic improvement is intended by reducing the area of the external base region, the base electrode can be formed stably. Moreover, an alignment margin can be taken in formation of the base lead. Thus, manufacturing yield is further improved. Moreover, the protrusion can be reinforced more strongly by the base electrode formed on the protrusion.

In the HBT of the first aspect of the invention, a surface layer of the first region and a surface layer of the second region are made of different materials, respectively.

With this constitution, since the surface layer of the first region and the surface layer of the second region are formed from different materials, thickness of the first region can be easily set by performing a selective etching which selectively etches to the different materials.

In one embodiment, the emitter layer in the first region has a thickness of not less than 5 nm and not more than 25 nm, and the emitter layers in the second region have a total thickness of not less than 40 nm.

With this constitution, since the emitter layer in the first region is set to a thickness not less than 5 nm and not more than 25 nm, the emitter layer in the vicinity of the emitter mesa portion is depleted within the normal bias voltage range. Further, since the emitter layers in the second region are totally set to a thickness of not less than 40 nm, the emitter layers in the second region, in particular, the protrusion is reinforced enough.

According to a second aspect of the present invention, there is provided a method for manufacturing a heterojunction bipolar transistor, comprising the steps of:

forming emitter layers on a base layer; forming an emitter mesa portion by forming the emitter layers into a mesa shape with lower layers of the emitter layers left at a first specified thickness; forming a mask over a region in an external base region, which is a region of the base layer outside the base layer under the emitter mesa portion, and distant from a side wall of the emitter mesa portion by a specified distance; and etching the lower layers on the external base region to make an emitter layer having a second specified thickness with the mask.

With this constitution, the second specified thickness can be set to such a thickness that the depletion can be achieved within the normal bias voltage range, while the first specified thickness can be set to such a thickness that the protrusion formed by the lower emitter layers on the external base region overhanging outside is increased in strength. Thus, an HBT superior in characteristics and high in yield can be formed easily by film deposition technique and photoetching technique.

In one embodiment, the mask is a base electrode.

With this constitution, since the base electrode is used as the mask, the region by a specified distance apart from the side wall of the emitter mesa portion can be formed in self alignment with the base electrode. Thus, the region for the emitter layer of the second specified thickness can be formed with excellent repeatability.

In one embodiment, the mask is formed of an insulating film.

With this constitution, an insulating film is used as the mask. Thus, the region of the second specified thickness can be formed with excellent repeatability by film deposition technique and etching technique.

In one embodiment, the step of forming the mask includes the steps of: forming an insulating film on the external base region and the side wall of the emitter mesa portion; and removing by etching the insulating film present on the side wall of the emitter mesa portion and the insulating film present within the specified distance from the side wall of the emitter mesa portion.

With this constitution, an insulating film is formed at a step gap of the emitter mesa portion formed in the external base region, and this insulating film is etched. In this connection, during the formation of the insulating film, because the step gap portion differs in composition, composition ratio or density from the other portions, the insulating film is etched at a higher etching rate in the step gap portion than in the other portions, so that only the insulating film present on the side wall of the emitter mesa portion and the insulating film present in the vicinity of the side wall of the emitter mesa portion are removed by etching. Therefore, by using the mask formed in this way, the region of the second specified thickness is formed in self alignment around the emitter mesa portion and thus formed with excellent repeatability.

In a third aspect for the present invention, there is provided a communication device using the HBT as described above.

The HBT in this aspect of the invention is free from damage of the protrusion formed by the emitter layers overhanging outside the external base region, as well as free from penetration of moisture through damaged places. With this constitution, HBTs having high characteristics as described above are used for power amplifiers of communication devices. Therefore, those communication devices to be used under various environments are improved in durability. In particular, for portable communication devices for which lower weight and smaller size are demanded, noticeably great effects can be obtained because of their insufficiency in air-tightness measures.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail by way of embodiments thereof illustrated in the accompanying drawings.

First Embodiment

Figure 1:
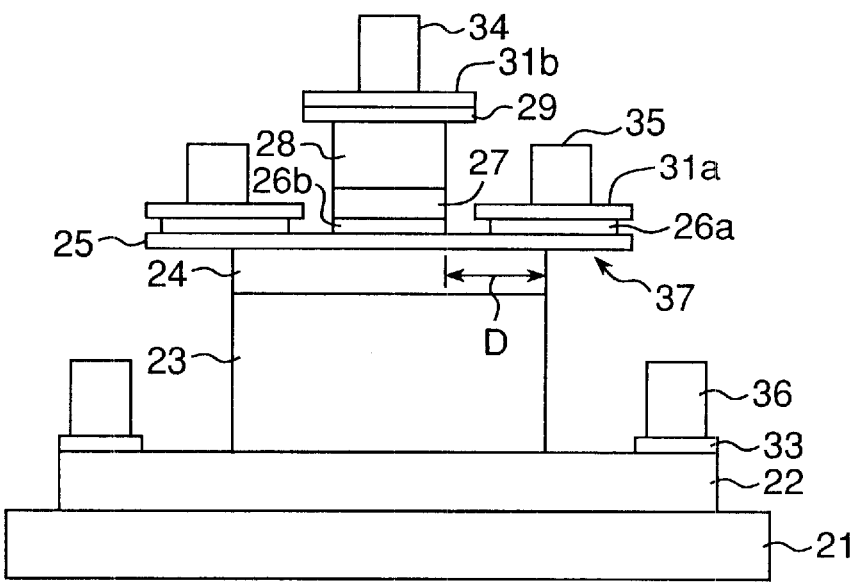
FIG. 1 is a longitudinal sectional view of an HBT of the present invention.
Figure 2:
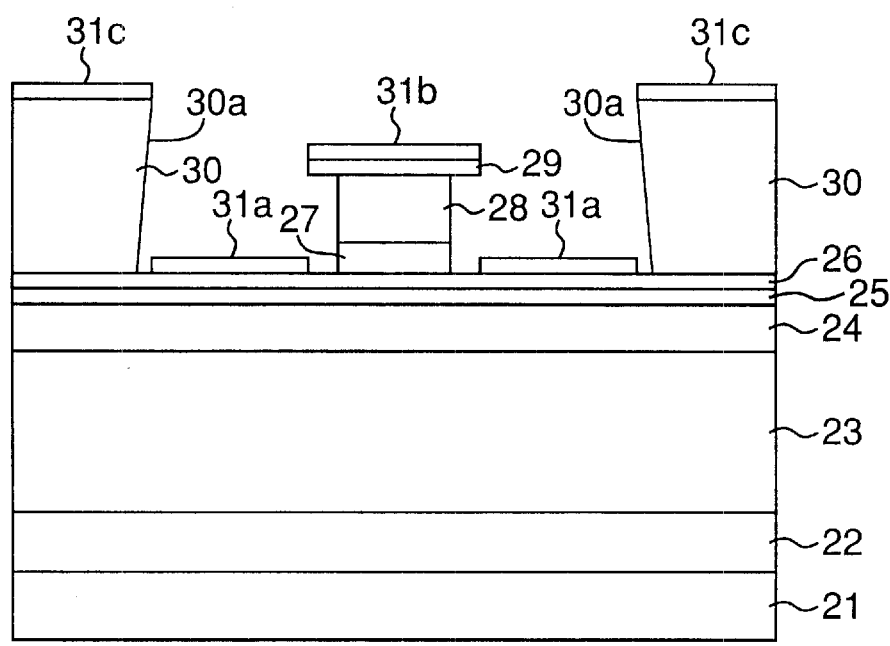
FIG. 2 is a longitudinal sectional view of the HBT shown in FIG. 1 in a manufacturing process thereof.
Figure 3:
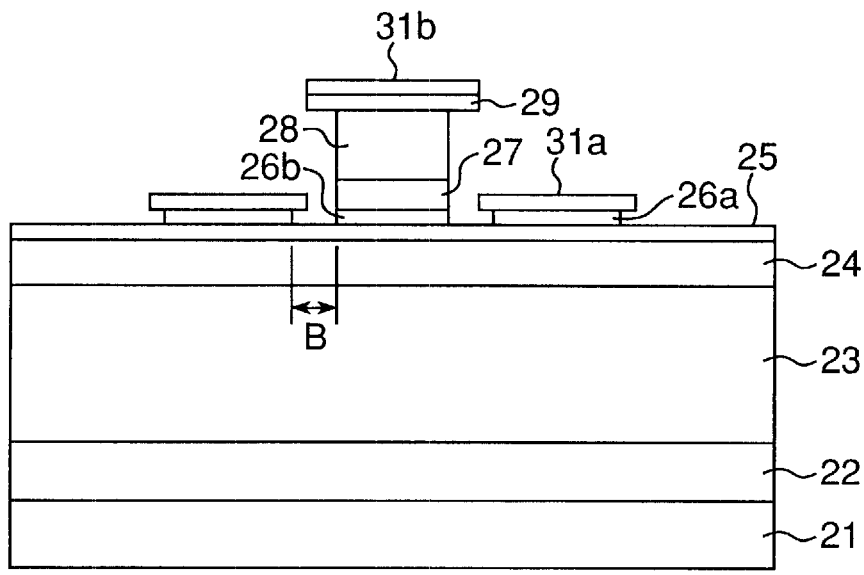
FIG. 3 is a longitudinal sectional view in a manufacturing process subsequent to FIG. 2.
Figure 4:
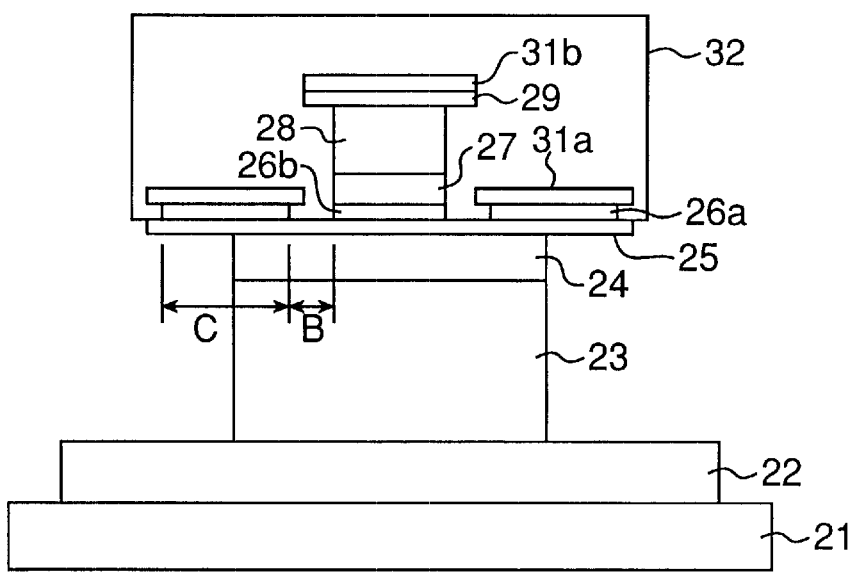
FIG. 4 is a longitudinal sectional view in a manufacturing process subsequent to FIG. 3.

FIG. 1 shows a longitudinal section of an HBT of this embodiment. FIGS. 2 to 4 show longitudinal sections, respectively, in the manufacturing process of the HBT shown in FIG. 1. Now a method for manufacturing the HBT of this embodiment is explained below with reference to FIGS. 1 to 4.

First, as shown in FIG. 2, on a semi-insulating GaAs substrate 21, are sequentially formed a collector contact layer (n$^+$ type GaAs with doping concentration $5 \times 10^{18}$ cm$^{-3}$, thickness 500 nm) 22, a collector layer (n$^+$ type GaAs with doping concentration $1 \times 10^{17}$ cm$^{-3}$, thickness 700 nm) 23, a base layer (n$^+$ type GaAs with doping concentration $5 \times 10^{19}$ cm$^{-3}$, thickness 70 nm) 24, a first emitter layer (n$^+$ type InGaP with doping concentration $5 \times 10^{17}$ cm$^{-3}$, thickness 20 nm) 25, a second emitter layer (n$^+$ type AlGaAs with doping concentration $5 \times 10^{17}$ cm$^{-3}$, thickness 30 nm) 26, a third emitter layer (n$^+$ type InGaP with doping concentration $5 \times 10^{17}$ cm$^{-3}$, thickness 50 nm) 27, and a contact layer (in an order from substrate side to top surface side, n$^+$ type AlGaAs—GaAs with doping concentration $5 \times 10^{18}$ cm$^{-3}$, thickness 50 nm; n$^+$ type GaAs—InGaAs with doping concentration $5 \times 10^{18}$ cm$^{-3}$, thickness 50 nm; and n$^+$ type InGaAs with doping concentration $5 \times 10^{18}$ cm$^{-3}$, thickness 100 nm) 28.

In HBTs, the contact layer 28 is generally used to connect up from the topmost surface layer to the emitter layer 27 with low resistance and, in this embodiment, is formed of three layers. The three layers do not have direct relation to the present invention, so omitted in description, and hereinafter will be expressed simply as contact layer 28.

Next, WN (tungsten nitride) is fabricated at a film thickness of 100 nm on the contact layer 28 by sputtering, a resist mask (not shown) is formed in the emitter formation region, and an emitter ohmic electrode 29 is fabricated by etching the WN by dry etching. Then, with the emitter ohmic electrode 29 used as a mask, etching of up to the third emitter layer 27 is done.

Next, with the resist mask removed, as shown in FIG. 2, a resist layer 30 having an opening 30a is formed in a region where a base ohmic electrode 31a is to be formed later, and the base ohmic electrode 31a is formed by evaporating an electrode material. In this process, a metal layer 31b is formed on the emitter ohmic electrode 29, and a metal layer 31c is formed on the resist layer 30.

In this embodiment, an etchant of phosphorus acid/ oxygenated water mixed system has been used for the etching of the contact layer 28, and an etchant of phosphorus acid/hydrochloric acid mixed solution has been used for the etching of the third emitter layer 27 made of InGaP. A multilayer metal material incorporating platinum, palladium or the like as the lowermost layer is preferable as the electrode material for the base ohmic electrode 31a. In this embodiment, platinum (with film thickness 50 nm), Ti (with film thickness 50 nm) and Au (with film thickness 100 nm) are deposited sequentially in self alignment on the emitter ohmic electrode 29 by using an overhanging form of the emitter ohmic electrode 29, by which the base ohmic electrode 31a is formed. Also, on the emitter ohmic electrode 29 is formed the metal layer 31b of the same material.

Next, the resist layer 30 and the metal layer 31c are removed by liftoff process. Thereafter, as shown in FIG. 3, with the base ohmic electrode 31a used as a mask, the second emitter layer 26 is etched with an etchant of citric acid/oxygenated water mixed system or the like. Thus, by exposing a surface of the first emitter layer 25, a second emitter layer 26a is formed in a base electrode formation region, and a spacing B is formed between an emitter mesa portion and the base electrode formation region.

Next, a resist pattern 32 to cover the external base region is formed as shown in FIG. 4, and with the resist pattern 32 used as a mask, the first emitter layer 25, the base layer 24 and the collector layer 23 are etched, by which a base mesa pattern is formed. At the same time, a second region C including the portion overhanging outside the external base region in the projected form is also formed. This second region C, which is composed of the first emitter layer 25 and a second emitter layer 26a, is formed thicker than a first region B.

In this embodiment, an etchant of hydrochloric acid/ phosphorus acid mixed solution has been used for the etching of the first emitter layer 25 made of InGaP. An etchant of the phosphorus acid/oxygenated water mixed system has been used for the etching of the base layer 24 and the collector layer 23.

Next, the resist pattern 32 is removed, and AuGe, Ni and Au are sequentially deposited over the collector-electrode formation part on the collector contact layer 22, so that a collector ohmic electrode 33 is formed as shown in FIG. 1, and an ohmic junction is formed by performing thermal treatment for 2 minutes at 390° C. Concurrently with this, the lowermost layer platinum of the base ohmic electrode 31a is diffused into the semiconductor, thereby forming an ohmic junction with the base layer 24. It is noted that since the surface of the contact layer 28 is made of InGaAs, connection of the emitter ohmic electrode 29 therewith can be achieved only by contact.

Finally, the collector contact layer 22 between individual HBTs is removed by etching, by which the individual HBTs are electrically isolated from one another. Ohmic-electrode lead electrodes 34, 35, 36 are formed on the emitter ohmic electrode 29, the base ohmic electrode 31a and the collector ohmic electrode 33, respectively. Thus, an HBT as shown in FIG. 1 is obtained.

As described above, according to this embodiment, a protrusion 37 formed in the second region C (see FIG. 4) in FIG. 1 is enough thick since the total film thickness of the first emitter layer 25 and the second emitter layer 26a is 50 nm. Therefore, during the process of forming the protrusion 37 by etching or during later processes, the protrusion 37 can be prevented from being damaged, by which the yield can be improved. Further, penetration of moisture or the like through damaged portions can be prevented, by which the reliability can be improved.

The base ohmic electrode 31a is formed from an external base region D continuously up to the protrusion 37. Therefore, the protrusion 37 is reinforced, becoming more hard to damage. Further, a large area for the base ohmic electrode 31a can be ensured, allowing an alignment margin to be taken for the formation of the base lead electrode 35. Therefore, the yield can be further improved.

This embodiment has been described on the assumption that the total film thickness of the first emitter layer 25 and the second emitter layer 26a is 50 nm. However, the total film thickness is not limited to this. Still however, the total film thickness is preferably beyond 40 nm in terms of strength. Meanwhile, the first emitter layer 25 indispensably needs to be depleted in the vicinity of the second emitter layer 26b with the operating bias voltage of the device, thus involving a film thickness of 5 nm–25 nm. Therefore, the second emitter layer 26a inevitably needs to have a film thickness of 35 nm–15 nm or more.

When the HBT according to the first embodiment was mounted as a power amplifier directly on a printed circuit board so that a portable communication device of a non-airtight structure was formed up, the HBT was able to be used without causing any failures.

Second Embodiment

Figure 5:
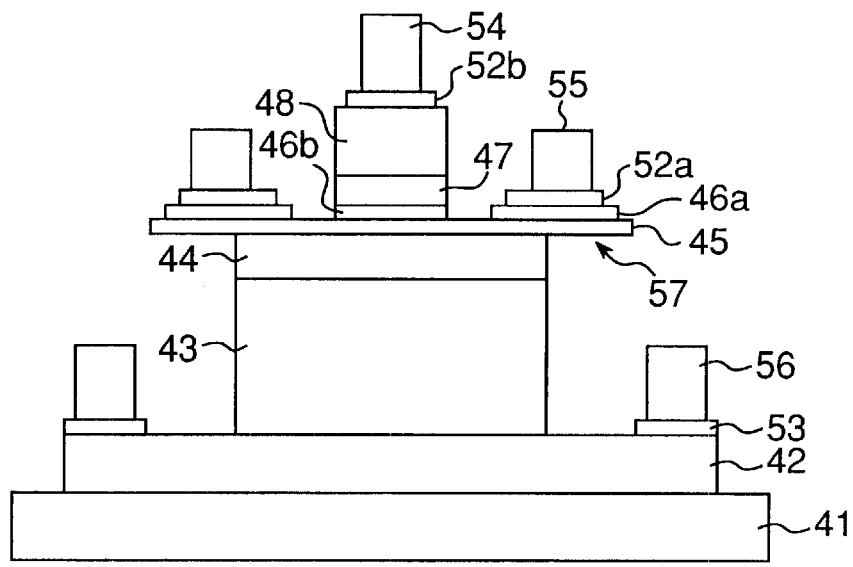
FIG. 5 is a longitudinal sectional view of an HBT other than FIG. 1.

FIG. 5 shows a longitudinal section of an HBT of this embodiment. FIGS. 6 to 9 show longitudinal sections, respectively, in the manufacturing process of the HBT shown in FIG. 5. Now the method for manufacturing the HBT of this embodiment is explained below with reference to FIGS. 5 to 9.

Figure 6:
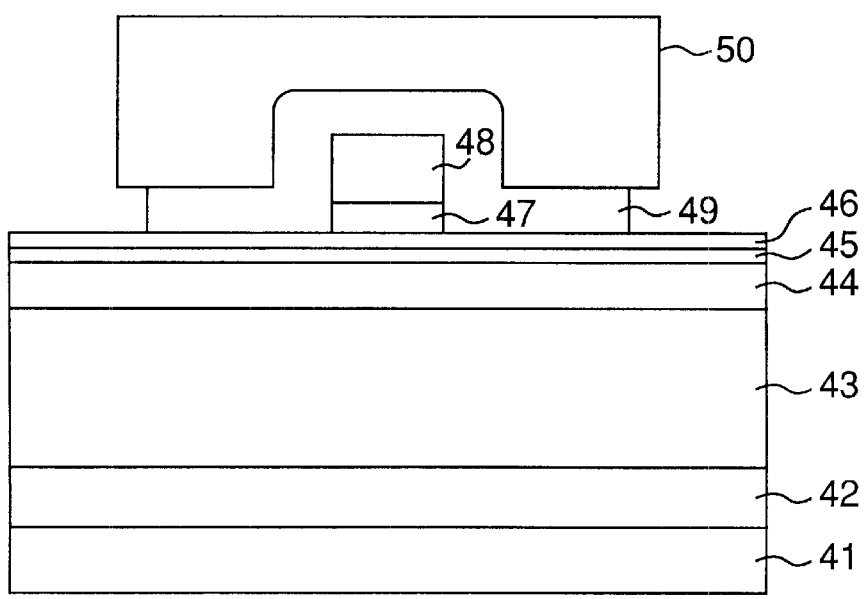
FIG. 6 is a longitudinal sectional view of the HBT shown in FIG. 5 in a manufacturing process thereof.

First, as shown in FIG. 6, on a semi-insulating GaAs substrate 41, are formed a collector contact layer 42, a collector layer 43, a base layer 44, a first emitter layer 45, a second emitter layer 46, a third emitter layer 47, and a contact layer 48 sequentially in the same manner as in the first embodiment.

Next, a resist mask (not shown) is formed in the emitter formation region on the contact layer 48. Then, etching of up to the third emitter layer 47 is done, by which an emitter mesa is formed. The resist mask is removed and an insulating film 49 is formed overall, by which a resist pattern 50 to cover the emitter mesa is formed. Then, the insulating film 49 is etched with the resist pattern 50 used as a mask. Thus, a multilayer structure body as shown in FIG. 6 is obtained.

In this embodiment, an etchant of the citric acid/ oxygenated water mixed system has been used for the etching of the contact layer 48, and an etchant of the phosphorus acid/hydrochloric acid mixed system has been used for the etching of the third emitter layer 47 made of InGaP. As the insulating film 49, silicon oxide, silicon nitride or the like may be used, and the insulating film may be formed by vapor deposition method such as plasma CVD or the like. In this embodiment, silicon nitride was formed by plasma CVD. For the etching of the insulating film 49, buffered hydrofluoric acid using hydrofluoric acid and ammonium fluoride mixed aqueous solution was used.

Figure 7:
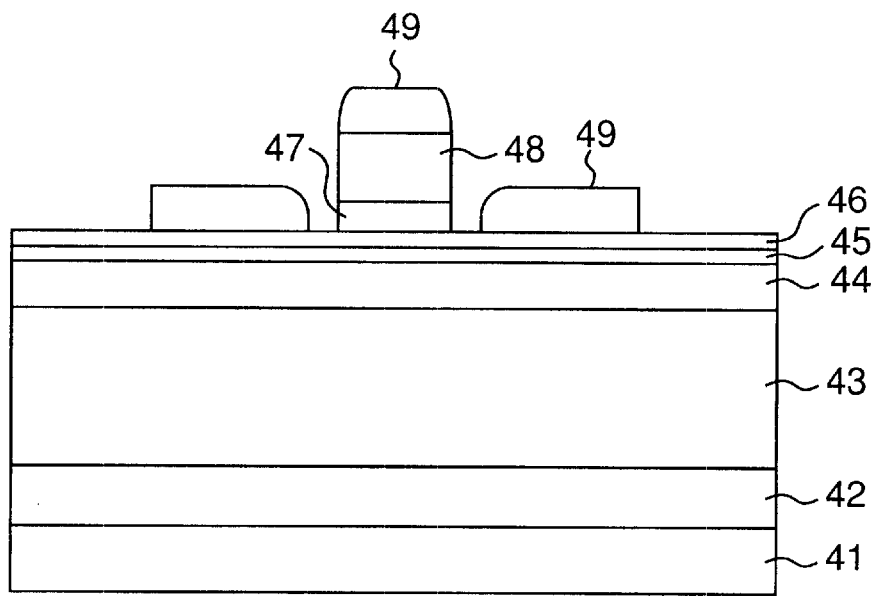
FIG. 7 is a longitudinal sectional view in a manufacturing process subsequent to FIG. 6.

After the resist pattern 50 is removed, the overall surface is etched again with the buffered hydrofluoric acid. Then, since the etching rate in a side wall is faster than a that in a planarized portion of the emitter mesa, a pattern in which the side wall has selectively been removed by etching can be obtained as shown in FIG. 7. In this case, even if an overhang is formed on the contact layer 48 as in the first embodiment, the etching rate of the insulating film formed thereon is higher in the side wall of the emitter mesa and the overhang than in the planarized portion. This could perhaps be attributed to a characteristic that in the vapor growth of the insulating film, film material gas would less be supplied to complicated-pattern places, resulting in sparse film quality or film material of varied composition ratio. Because of this, if an etchant has a property that the etchant etches the vapor-grown insulating film to be removed and hardly etches the ground semiconductor, a pattern in which the side wall has selectively been removed by etching can be obtained by a similar process. Also, the insulating film 49, which is finally removed, may be given by a film of relatively high electrical conductivity. In particular, silicon oxide and silicon nitride films or films of their intermediate compositions are those which are generally used for semiconductor processes and which exhibit larger difference in etching rate at the side wall in the emitter mesa, hence suitable for this process.

Figure 8:
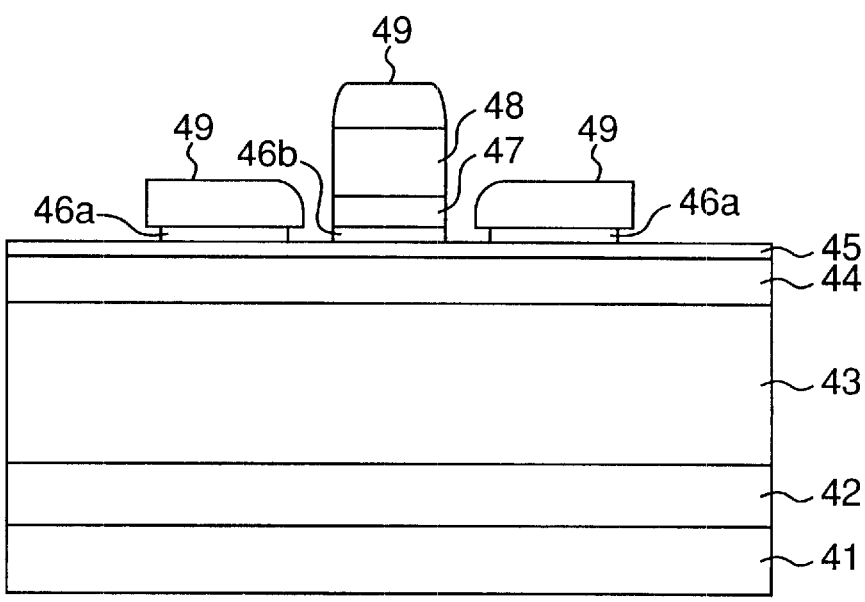
FIG. 8 is a longitudinal sectional view in a manufacturing process subsequent to FIG. 7.

Next, as shown in FIG. 8, with the insulating film 49 used as a mask, the second emitter layer 46 is selectively etched by an etchant of the citric acid/oxygenated water mixed system or the like, by which a surface of the first emitter layer 45 is exposed. As a result, a second emitter layer 46b is formed in the emitter region, while a second emitter layer 46a is formed in the base electrode formation region.

Figure 9:
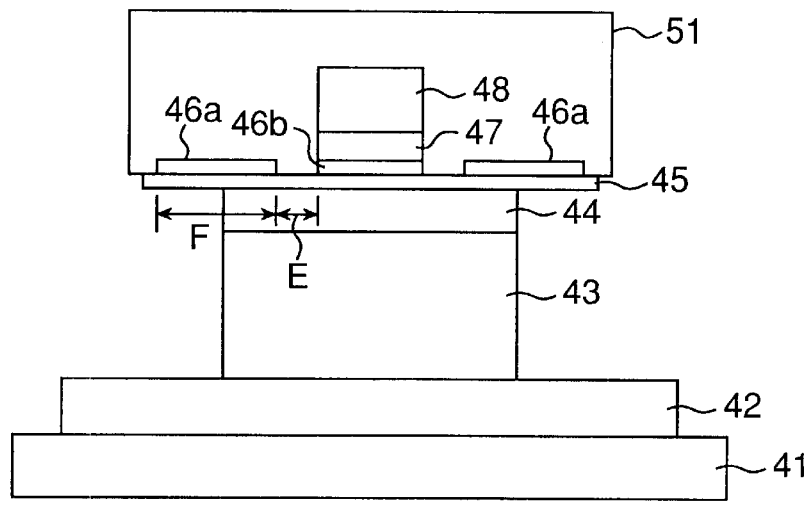
FIG. 9 is a longitudinal sectional view in a manufacturing process subsequent to FIG. 8.

Next, as shown in FIG. 9, the insulating film 49 is removed. Then, a first region E in which the first emitter layer 45 is exposed is formed around the emitter mesa. Subsequently, a resist pattern 51 to cover the external base region is formed, and the first emitter layer 45, the base layer 44 and the collector layer 43 are removed by etching, by which a base mesa pattern is formed. At the same time, a second region F including the portion overhanging outside the external base region in the protruded form is also formed. This second region F, which is composed of the first emitter layer 45 and the second emitter layer 26a, is formed thicker than the first region E. Subsequently, a resist pattern (not shown) to cover the device region is formed, and the collector contact layer 42 between individual HBTs is removed by etching, thereby electrically isolating the individual HBTs from one another.

Next, resist (not shown) having openings at regions where an emitter ohmic electrode and a base ohmic electrode are to be formed is formed, the electrode material is evaporated and lifted off, by which a base ohmic electrode 52a and an emitter ohmic electrode 52b are formed as shown in FIG. 5. A multilayer metal material incorporating platinum, palladium or the like as the lowermost layer is preferable as the electrode material. In this embodiment, palladium (50 nm), Ti (50 nm) and Au (100 nm) were deposited sequentially.

Next, AuGe, Ni and Au are sequentially deposited over the collector-electrode formation part on the collector contact layer 42, so that a collector ohmic electrode 53 is formed as shown in FIG. 5, and an ohmic junction is formed by performing thermal treatment for 2 minutes at 390° C. Concurrently with this, the lowermost layer palladium of the base ohmic electrode 52a is diffused into the semiconductor, thereby forming an ohmic junction with the base layer 44. It is noted that since the surface of the contact layer 48 is made of InGaAs, connection of the emitter ohmic electrode 52b therewith can be achieved only by contact.

Finally, ohmic-electrode lead electrodes 54, 55, 56 are formed on the emitter ohmic electrode 52b, the base ohmic electrode 52a and the collector ohmic electrode 53, respectively.

As described above, according to this embodiment, a protrusion 57 formed in the second region F (see FIG. 9) in FIG. 5 is enough thick by virtue of its double structure of the first emitter layer 45 and the second emitter layer 46a. Therefore, during the process of forming the protrusion 57 by etching or during later processes, the protrusion 57 can be prevented from being damaged, by which the yield can be improved. Further, penetration of moisture or the like through damaged portions can be prevented, by which the reliability can be improved.

Since the base ohmic electrode 52a is formed from the external base region continuously up to the protrusion 57 as in the first embodiment, the protrusion 57 is reinforced and, besides, an alignment margin can be taken for the formation of the base lead electrode 55.

In the first embodiment and the second embodiment, the first regions B, E made of a thin emitter layer and the second regions C, F made of a thick emitter layer have been shown in longitudinal cross sections. In this case, the planar shapes of the first region made of a thin emitter layer and the second region made of a thick emitter layer may be provided in various forms as shown in FIG. 10.

That is, referring to FIG. 10, broken lines 61, 71, 81 and 91 show the boundaries of the external base region. Further, reference numerals 62, 72, 82 and 92 denote emitter mesa portions, reference numerals 63, 73, 83 and 93 denote the first regions present on the external base region, reference numerals 64, 74, 84 and 94 denote the second regions present on the external base region, reference numerals 65, 75, 85 and 95 denote the second regions present outside the external base region, reference numerals 76 and 86 denote the first regions present outside the external base region, and reference numeral 97 denotes a region where the first and the second regions are absent on the external base region.

Figure 10A:
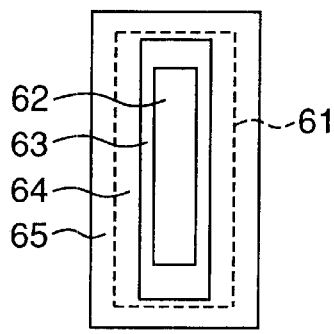
FIGS. 10A, 10B, 10C and 10D are views showing the planar shapes of an external base region, an emitter mesa part, a thin emitter layer and a thick emitter layer, respectively.
Figure 10B:
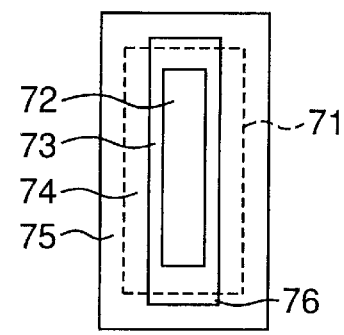
Figure 10C:
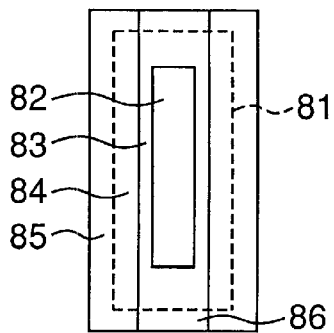
Figure 10D:
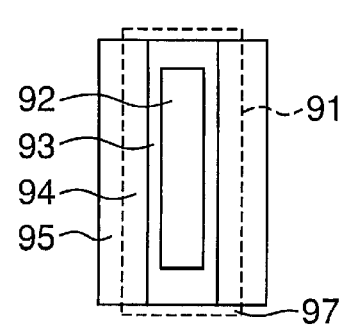
Figure 11:
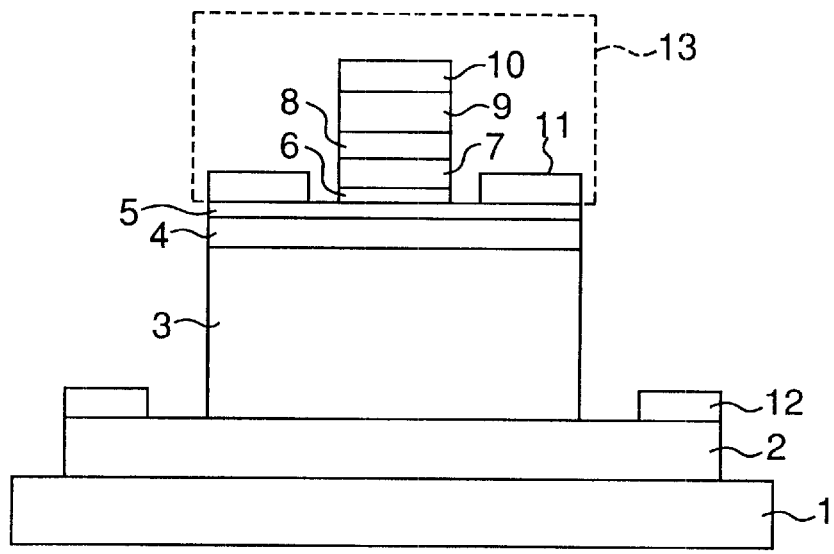
FIG. 11 is a longitudinal sectional view of an HBT structure according to the prior art.
Figure 12:
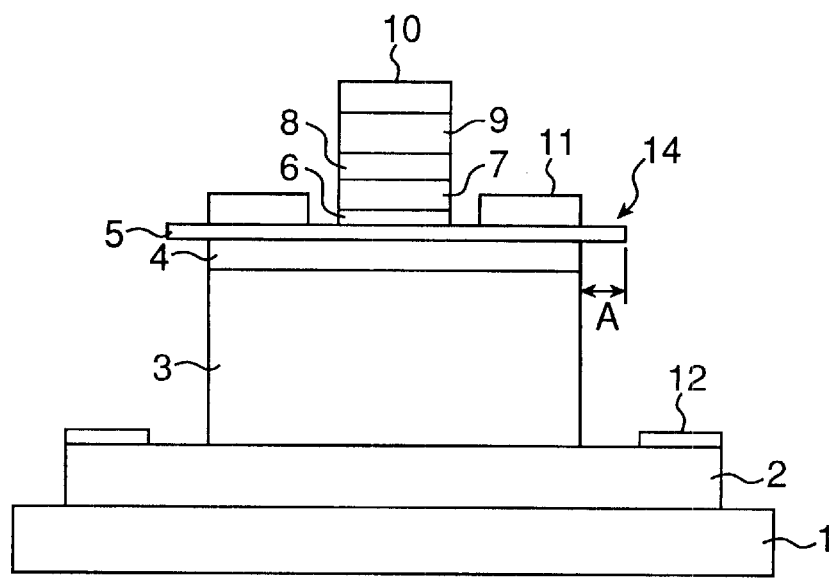
FIG. 12 is a longitudinal sectional view showing an actual structure of the HBT shown in FIG. 11.
Figure 13:
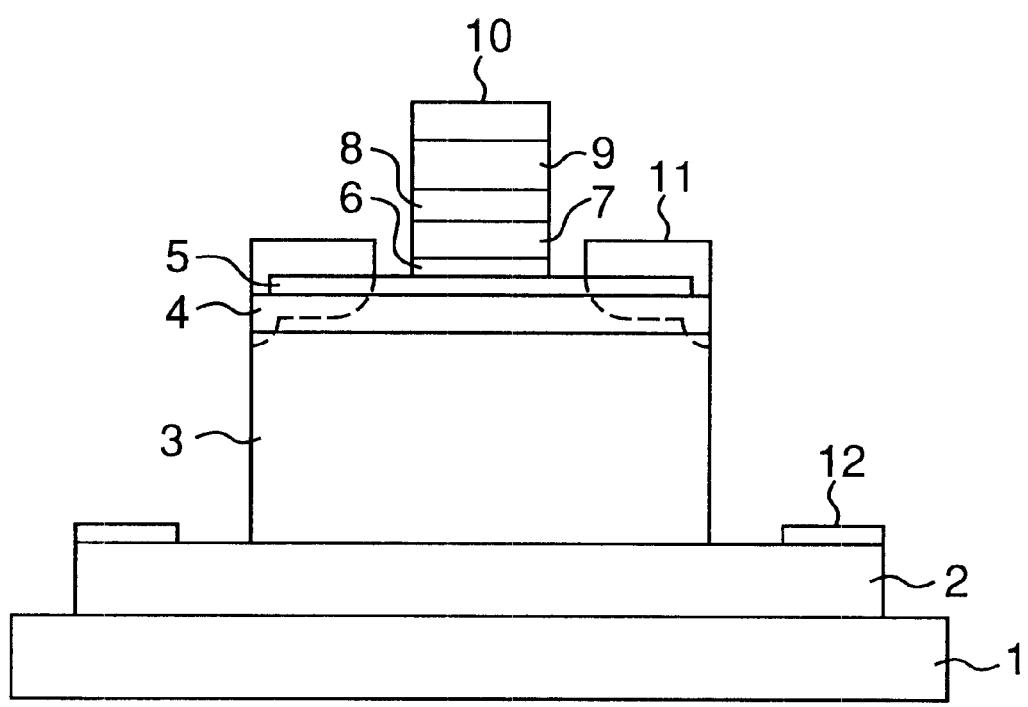
FIG. 13 is an explanatory view of an ohmic junction state in which the protrusions of an the emitter layer in FIG. 12 have been removed.

Out of FIGS. 10A–10D, FIG. 10A shows the most preferable structure, where an emitter mesa portion 62 is surrounded over its entire periphery by the second region 64 in which thick emitter layers are formed and which is present on the external base region. In the structure of FIG. 10B, on the external base region outside both breadthwise ends of the emitter mesa portion 72, the second region in which thick emitter layers are formed is not present but only the first region 73 in which a thin emitter layer is formed is present. That is, the thin emitter layer continues up to the periphery of the external base region. In the structure of FIG. 10C, the second region in which thick emitter layers are formed is not present outside both breadthwise ends of the emitter mesa portion 82. That is, the thin emitter layer continues up to the distal end. In the structure of FIG. 10D, the emitter layer does not overhang outside the external base region outside both breadthwise ends of the emitter mesa portion 92 (the protrusion is absent). That is, since side ends of the emitter layer are located inside the side ends of the external base region in that region, the base layer is exposed. For this reason, when the base electrode ohmic material is diffused into the base layer with an ohmic junction, the base electrode ohmic material would be diffused even to the collector layer. Therefore, in this case, it is preferable to form no base electrode in the neighborhood of both breadthwise ends of the emitter mesa portion 92.

In the cases of FIGS. 10B–10D, the second region in which thick emitter layers are formed is absent on the external base region outside both breadthwise ends of the emitter mesa portion 72, 82, 92, and therefore the protrusion-formed emitter layer is not reinforced. However, the second region 74, 84, 94 is present on the external base region outside both lengthwise ends of the emitter mesa portion 72, 82, 92, so that most of the protrusion around the emitter mesa portion 72, 82, 92 are reinforced. Therefore, even in the cases of FIGS. 10B–10D, it is realizable to improve the manufacturing yield.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A heterojunction bipolar transistor, comprising:
   an emitter mesa portion including at least one emitter layer;
   a base layer including an internal base layer region situated under the emitter mesa portion and an external base layer region situated outside the internal base layer region; and a lower emitter layer situated between the emitter mesa portion and the base layer, the lower emitter layer including:
  a first external lower emitter layer region situated outside the emitter mesa portion, and
  a second external lower emitter layer region situated outside the first external lower emitter layer region,
  wherein a thickness of the lower emitter layer in the second external lower emitter layer region is thicker than that in the first external lower emitter layer region,
  wherein the second external lower emitter layer region crosses over an outer edge of the base layer to protrude outside the outer edge.

2. The heterojunction bipolar transistor according to claim 1, wherein
  the lower emitter layer comprises at least one layer in the first external lower emitter layer region, and said at least one layer plus at least one additional layer in the second external lower emitter layer region.

3. The heterojunction bipolar transistor according to claim 1, wherein
  a base electrode is provided on the second external lower emitter layer region crossing over the outer edge of the external base region.

4. The heterojunction bipolar transistor according to claim 2, wherein
  said at least one layer in the first external emitter lower layer region and said at least one additional layer in the second external lower emitter layer region are made of different materials, respectively.

5. The heterojunction bipolar transistor according to claim 2, wherein
  a total thickness of the lower emitter layer in the first external lower emitter layer region is not less than 5 nm and not more than 25 nm, and
  a total thickness of the lower emitter layer in the second external lower emitter layer region is not less than 40 nm.

6. A communication device using the heterojunction bipolar transistor as defined in claim 1.

* * * * *